United States Patent
Cho

(10) Patent No.: US 11,650,236 B2
(45) Date of Patent: May 16, 2023

(54) APPARATUS AND METHOD FOR MEASURING VOLTAGE STANDING WAVE RATIO OF ANTENNA IN WIRELESS COMMUNICATION SYSTEM

(71) Applicant: Samsung Electronics Co., Ltd., Suwon-si (KR)

(72) Inventor: Donggeun Cho, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 640 days.

(21) Appl. No.: 16/608,773

(22) PCT Filed: Apr. 24, 2018

(86) PCT No.: PCT/KR2018/004705
§ 371 (c)(1),
(2) Date: Oct. 25, 2019

(87) PCT Pub. No.: WO2018/199580
PCT Pub. Date: Nov. 1, 2018

(65) Prior Publication Data
US 2020/0348346 A1  Nov. 5, 2020

(30) Foreign Application Priority Data
Apr. 25, 2017  (KR) .......... 10-2017-0052879

(51) Int. Cl.
*G01R 27/08* (2006.01)
*H04B 17/10* (2015.01)
(Continued)

(52) U.S. Cl.
CPC .......... *G01R 27/08* (2013.01); *H04B 17/101* (2015.01); *H04B 17/14* (2015.01); *H04B 17/20* (2015.01)

(58) Field of Classification Search
CPC ........ G01R 27/00; G01R 27/02; G01R 27/04; G01R 27/06; G01R 27/08; H04B 17/10–14; H04B 17/20–29
See application file for complete search history.

(56) References Cited

U.S. PATENT DOCUMENTS 7,076,213 B2 * 7/2006 Lee .................... H04B 17/0085
455/115.2
2003/0137364 A1 * 7/2003 Nishida .................... H04B 1/52
333/133

(Continued)

FOREIGN PATENT DOCUMENTS

JP  2008-537126 A  9/2008
JP  2013-503331 A  1/2013

(Continued)

OTHER PUBLICATIONS

Notice of Preliminary Rejection dated May 10, 2021 in connection with Korean Application No. 10-2017-0052879, 14 pages.

(Continued)

*Primary Examiner* — Huy Q Phan
*Assistant Examiner* — David B Frederiksen

(57) ABSTRACT

The present disclosure relates to a pre-5$^{th}$-Generation (5G) or 5G communication system to be provided for supporting higher data rates Beyond 4$^{th}$-Generation (4G) communication system such as Long Term Evolution (LTE).
In a wireless communication system, a transmission apparatus comprises at least one antenna port for transmitting/receiving a signal, an analogue filter for selecting the frequency of the signal, and a voltage standing wave ratio (VSWR) detection unit for measuring the VSWR of the antenna port, wherein the VSWR detection unit is configured to detect both a forward signal and a reverse signal for an input terminal of the analogue filter, to determine the respective power values of a forward signal and a reverse (Continued)

signal for an output terminal of the analogue filter by applying characteristic parameters of the analogue filter to the detected forward signal and receive signal, and to determine the VSWR of the antenna port on the basis of the respective power values of the forward signal and the reverse signal for the output terminal of the analogue filter.

14 Claims, 13 Drawing Sheets

(51) Int. Cl.
*H04B 17/20* (2015.01)
*H04B 17/14* (2015.01)

(56) References Cited

U.S. PATENT DOCUMENTS

| | | | | |
|---|---|---|---|---|
| 2007/0010216 | A1* | 1/2007 | Neustadt | H04B 17/318 455/67.11 |
| 2008/0186243 | A1* | 8/2008 | Black | H01Q 9/28 343/773 |
| 2008/0252301 | A1 | 10/2008 | Kaehs | |
| 2009/0168753 | A1* | 7/2009 | Campero | H04L 49/30 370/351 |
| 2010/0085260 | A1* | 4/2010 | McKinzie | H01Q 9/145 343/745 |
| 2012/0206304 | A1 | 8/2012 | Clow et al. | |
| 2012/0319803 | A1* | 12/2012 | Schick | H01P 1/20345 333/204 |
| 2013/0245976 | A1* | 9/2013 | Hind | G01R 29/10 702/65 |
| 2014/0050114 | A1* | 2/2014 | Gao | G01R 27/06 370/252 |
| 2014/0050282 | A1 | 2/2014 | Watanabe | |
| 2015/0288461 | A1* | 10/2015 | Barabash | H04W 24/06 455/115.1 |
| 2017/0141802 | A1* | 5/2017 | Solomko | H04B 1/0458 |

FOREIGN PATENT DOCUMENTS

| | | |
|---|---|---|
| KR | 10-2010-0068821 A | 6/2010 |
| KR | 10-2012-0120751 A | 11/2012 |
| KR | 10-1415541 B1 | 7/2014 |
| KR | 10-1471297 B1 | 12/2014 |
| KR | 10-2017-0042796 A | 4/2017 |

OTHER PUBLICATIONS

ISA/KR, International Search Report and Written Opinion of the International Searching Authority, International Application No. PCT/KR2018/004705, dated Aug. 10, 2018, 11 pages.

Korean Intellectual Property Office, "Notice of Preliminary Rejection" dated Jan. 25, 2022, in connection with Korean Application No. 10-2017-0052879, 10 pages.

Notice of Patent Grant dated Jul. 25, 2022 in connection with Korean Patent Application No. 10-2017-0052879, 3 pages.

* cited by examiner

APPARATUS AND METHOD FOR MEASURING VOLTAGE STANDING WAVE RATIO OF ANTENNA IN WIRELESS COMMUNICATION SYSTEM

CROSS-REFERENCE TO RELATED APPLICATIONS

This application is a 371 National Stage of International Application No. PCT/KR2018/004705, filed Apr. 24, 2018, which claims priority to Korean Patent Application No. 10-2017-0052879, filed Apr. 25, 2017, the disclosures of which are herein incorporated by reference in their entirety.

BACKGROUND

1. Field

The disclosure generally relates to a wireless communication system and, more particularly, to an apparatus and a method for measuring the voltage standing wave ratio (VSWR) of an antenna.

2. Description of Related Art

To meet the demand for wireless data traffic having increased since deployment of $4^{th}$ generation (4G) communication systems, efforts have been made to develop an improved $5^{th}$ generation (5G) or pre-5G communication system. Therefore, the 5G or pre-5G communication system is also called a 'Beyond 4G Network' or a 'Post Long Term Evolution (LTE) System'.

The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems.

In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like.

In the 5G system, Hybrid frequency shift keying (FSK) and quadrature amplitude modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

In a wireless communication system, a voltage standing wave ratio (VSWR) may be measured to determine whether an antenna port of a base station is normally connected. A standing wave refers to a waveform generated when incident and reflected waves generated in a waveguide, a coaxial cable, or other transmission lines overlap. A voltage standing wave ratio, i.e., VSWR, may be determined as the ratio between the voltage amplitude of a standing wave at the maximum voltage point and the voltage amplitude thereof at the adjacent minimum voltage point. The system operator of a base station may measure the VSWR, thereby determining whether a particular antenna is normal or abnormal. For example, when a VSWR for a particular frequency assignment (FA) of the base station exceeds a predetermined reference value, the system operator may detect that an antenna of the base station for the particular FA is malfunctioning.

However, although it is possible to determine whether an antenna is normal or abnormal by measuring the VSWR, measurement errors may occur due to conflict between various devices installed in the base station. Therefore, a method for minimizing errors occurring in a VSWR measurement process is required.

SUMMARY

Therefore, the disclosure has been made in view of the above-mentioned problem, and the disclosure is to provide an apparatus and a method for measuring a voltage standing wave ratio (VSWR) for maintaining high accuracy in a wireless communication system.

The disclosure is to provide an apparatus and a method for measuring a VSWR in view of an error due to a filter in a wireless communication system.

The disclosure is to provide an apparatus and a method for measuring a characteristic of a filter embedded in a base station in a wireless communication system.

According to various embodiments of the disclosure, an operating method of a transmitter in a wireless communication system includes: detecting a forward signal and a reverse signal at an input terminal of an analog filter; determining a power value of a forward signal and a power value of a reverse signal at an output terminal of the analog filter by applying characteristic parameters of the analog filter to the detected forward signal and reverse signal; and determining a voltage standing wave ratio (VSWR) of an antenna of the transmitter on the basis of the power value of the forward signal and the power value of the reverse signal at the output terminal of the analog filter.

According to various embodiments of the disclosure, a transmission apparatus in a wireless communication system includes: at least one antenna port configured to transmit and receive a signal; an analog filter configured to perform a frequency selection function of the signal; and a VSWR detector configured to measure a VSWR of the antenna port, wherein the VSWR detector: detects a forward signal and a reverse signal at an input terminal of the analog filter; determines a power value of a forward signal and a power value of a reverse signal at an output terminal of the analog filter by applying characteristic parameters of the analog filter to the detected forward signal and reverse signal; and determines the VSWR of the antenna port on the basis of the power value of the forward signal and the power value of the reverse signal at the output terminal of the analog filter.

According to various embodiments of the disclosure, an operating method for determining characteristic parameters of an analog filter in a wireless communication system includes: measuring a first VSWR at an input terminal of the analog filter when a load connected to an output terminal of the analog filter is in a short-circuited state; measuring a second VSWR at the input terminal of the analog filter when the load connected to the output terminal of the analog filter is in an open state; measuring a third VSWR at the input terminal of the analog filter when the load connected to the output terminal of the analog filter has a pre-designated resistance value; and determining the characteristic parameters of the analog filter on the basis of the measured first, second, and third VSWRs.

According to various embodiments of the disclosure, an apparatus for determining characteristic parameters of an analog filter in a wireless communication system includes: a detector configured to detect a signal flowing in an input terminal and an output terminal of the analog filter; and a controller configured to be combined with the detector, wherein the controller: measures a first VSWR at the input terminal of the analog filter when a load connected to the output terminal of the analog filter is in a short-circuited state; measures a second VSWR at the input terminal of the analog filter when the load connected to the output terminal of the analog filter is in an open state; and measures a third VSWR at the input terminal of the analog filter when the load connected to the output terminal of the analog filter has a pre-designated resistance value, and the characteristic parameters of the analog filter are determined on the basis of the measured first, second, and third VSWRs.

An apparatus and a method according to various embodiments of the disclosure may provide a voltage standing wave ratio (VSWR) measurement method having a simple structure and minimizing a measurement error in view of the characteristics of a device embedded in a base station.

Effects which can be acquired by the disclosure are not limited to the above described effects, and other effects that have not been mentioned may be clearly understood by those skilled in the art from the following description.

DETAILED DESCRIPTION

The terms used in the disclosure are only used to describe specific embodiments, and are not intended to limit the disclosure. A singular expression may include a plural expression unless they are definitely different in a context. Unless defined otherwise, all terms used herein, including technical and scientific terms, have the same meaning as those commonly understood by a person skilled in the art to which the disclosure pertains. Such terms as those defined in a generally used dictionary may be interpreted to have the meanings equal to the contextual meanings in the relevant field of art, and are not to be interpreted to have ideal or excessively formal meanings unless clearly defined in the disclosure. In some cases, even the term defined in the disclosure should not be interpreted to exclude embodiments of the disclosure.

Hereinafter, various embodiments of the disclosure will be described based on an approach of hardware. However, various embodiments of the disclosure include a technology that uses both hardware and software and thus, the various embodiments of the disclosure may not exclude the perspective of software.

Hereinafter, the disclosure describes a technology for measuring a voltage standing wave ratio (VSWR) in a wireless communication system.

As used herein, terms referring to particular signals (e.g., a forward signal and a reverse signal), terms referring to filters (e.g., an analog filter and a digital filter), terms referring to a load, terms referring to components of an apparatus, and the like are used for convenience of explanation. Therefore, the disclosure is not limited by the following terms, and other terms having equivalent technical meanings may be used.

Figure 1:
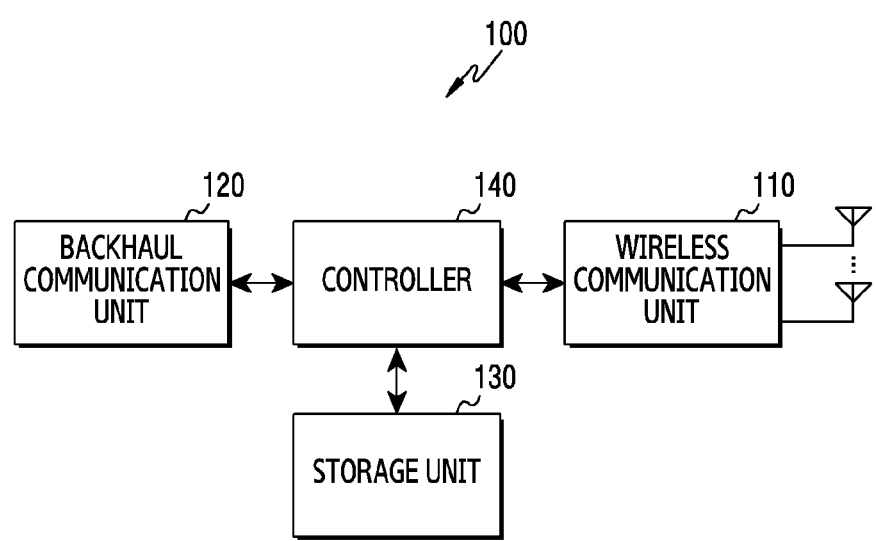
FIG. 1 illustrates the configuration of a transmission apparatus according to various embodiments of the disclosure.

FIG. 1 illustrates the configuration of a transmission apparatus according to various embodiments of the disclosure. The terms 'unit,' '-or/er,' and the like used herein indicate a unit for processing at least one function or operation, which may be implemented by hardware, software, or a combination thereof.

The transmission apparatus 100 illustrated in FIG. 1 may refer to a node using a wireless channel in a wireless communication system. For example, the transmission apparatus 100 may be a base station that transmits and receives a wireless signal to and from a terminal in a millimeter-wave (mmWave) band (e.g., 28 GHz, 30 GHz, 38 GHz, or 60 GHz). In this case, the transmission apparatus 100 may be referred to as an access point (AP), an eNodeB (eNB), a 5th-generation (5G) node, a wireless point, a transmission/reception point (TRP), or other terms with equivalent technical meanings. In another example, the transmission apparatus 100 may be a terminal that transmits and receives a wireless signal to and from a base station. In this case, the transmission apparatus 100 may be a device performing machine-type communication (MTC) and may not be carried by a user. The transmission apparatus 100 may be referred to as user equipment (UE), a mobile station, a subscriber station, a remote terminal, a wireless terminal, a user device, or other terms with equivalent technical meanings.

Referring to FIG. 1, the transmission apparatus 100 includes a plurality of antennas, a wireless communication unit 110, a backhaul communication unit 120, a storage unit 130, and a controller 140. Although FIG. 1 illustrates an example of the configuration of the transmission apparatus 100, various modifications may be made to the individual components according to various embodiments. In one embodiment, the number of individual components included in the transmission apparatus 100 may be at least one, and one component may be included in another component. For example, when the transmission apparatus 100 is a terminal that transmits and receives a signal to and from a base station, the transmission apparatus 100 may not include the backhaul communication unit 120.

The wireless communication unit 110 performs functions of transmitting or receiving a signal through a wireless channel. In one embodiment, the wireless communication unit 110 performs a function of conversion between a baseband signal and a bitstream according to the physical layer specification of a system. For example, in data transmission, the wireless communication unit 110 encodes and modulates a transmitted bitstream to generate complex symbols. In another example, in data reception, the wireless communication unit 110 demodulates and decodes a baseband signal to reconstruct a received bitstream. In another embodiment, the wireless communication unit 110 upconverts a baseband signal into a radio-frequency (RF) band signal, and may transmit the RF band signal through an antenna. The wireless communication unit 110 downconverts an RF band signal, received through the antenna, into a baseband signal. Accordingly, the wireless communication unit 110 may be referred to as a transmitter, a receiver, or a transceiver. From the aspect of hardware, the wireless communication unit 110 may include a digital unit to process a digital signal and an analog unit to process an analog signal.

The backhaul communication unit 120 provides an interface for performing communication with other nodes in a network. That is, the backhaul communication unit 120 converts a bitstream, which is transmitted from the transmission apparatus 100 to another node, for example, another access node, another base station, a higher node, a core network, or the like, into a physical signal, and converts a physical signal, which is received from another node, into a bitstream. For example, when the transmission apparatus 100 is configured as apart of a cellular communication system (e.g., a system supporting 5G, LTE, or LTE-A), the backhaul communication unit 120 may enable the transmission apparatus 100 to communicate with other nodes via a wired or wireless backhaul connection. In another example, when the transmission apparatus 100 is configured as an access point, the backhaul communication unit 120 may enable the transmission apparatus 100 to perform transmission to a greater network (e.g., the Internet) via a wired or wireless local area network or via a wired or wireless connection.

The storage unit 130 stores data, such as a default program, an application, and setting information, for the operation of the transmission apparatus 100. The storage unit 130 may be configured as volatile memory, nonvolatile memory, or a combination of volatile memory and nonvolatile memory. The storage unit 130 provides the stored data in response to a request from the controller 140.

The controller 140 controls the overall operation of the transmission apparatus 100. For example, the controller 140 transmits and receives a signal through the wireless communication unit 110 or the backhaul communication unit 120. Further, the controller 140 records and reads data in the storage unit 130. To this end, the controller 140 may include at least one processor.

Figure 2:
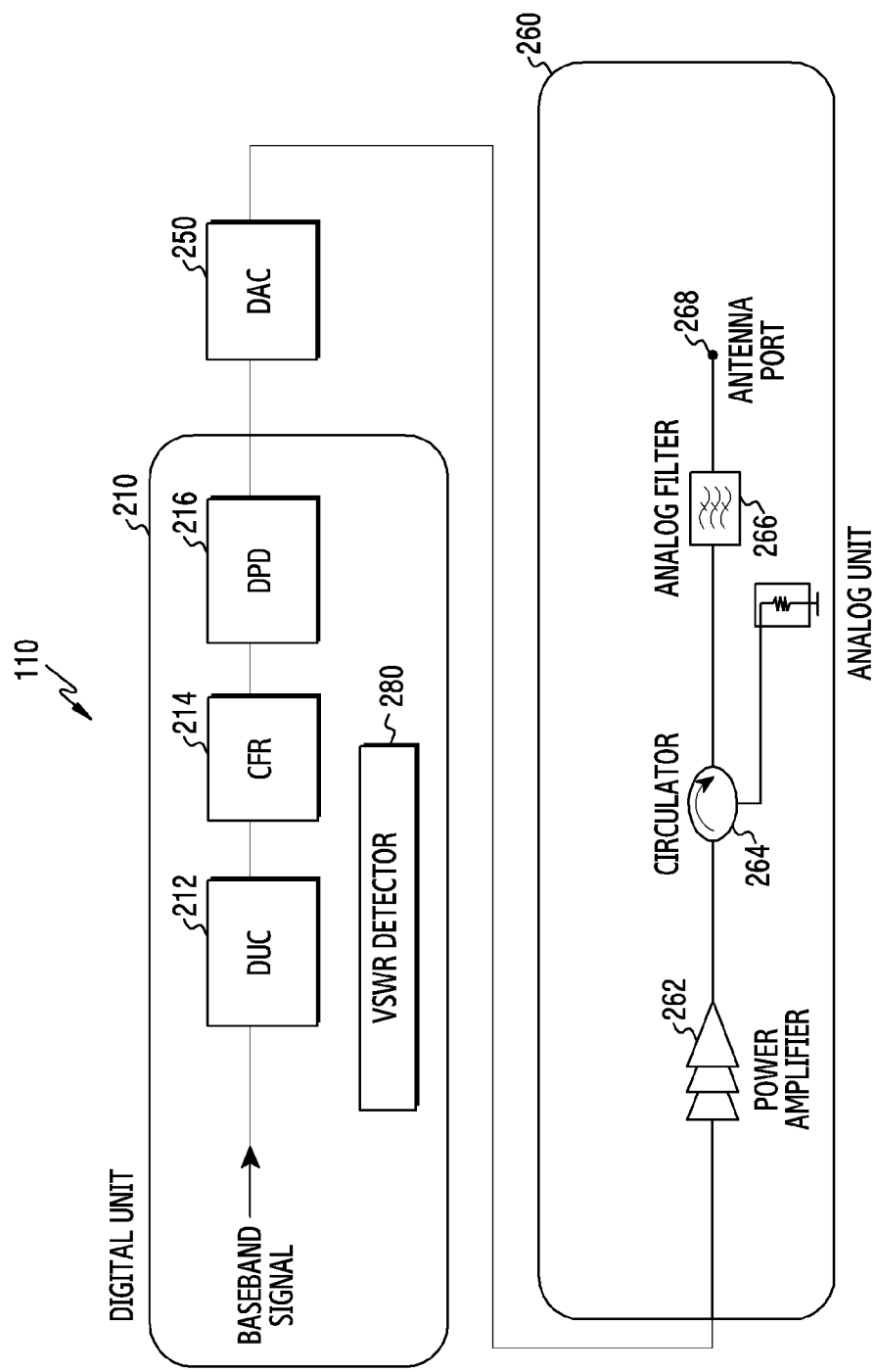
FIG. 2 illustrates the configuration of a wireless communication unit according to various embodiments of the disclosure.

FIG. 2 illustrates the configuration of a wireless communication unit according to various embodiments of the disclosure. FIG. 2 illustrates a specific configuration of the wireless communication unit 110 illustrated in FIG. 1. Each unit or subunit described below refers to a unit of processing at least one function or operation and may be an instruction/code to implement operations described below, a storage space storing the instruction/code, or part of circuitry forming the wireless communication unit 110.

Referring to FIG. 2, the wireless communication unit 110 may include a digital unit 210 to process a digital signal, a digital/analog converter (DAC) 250 to convert a digital signal into an analog signal, and an analog unit 260 to process an analog signal. Each unit may include a plurality of subunits depending on the implementation method. Although FIG. 2 illustrates an example of the wireless communication unit 110, various modifications may be made to each component or each subunit according to various embodiments. In one embodiment, the number of individual components or subunits included in the wireless communication unit 110 may be at least one, and one component may be included in another component.

A digital upconverter (DUC) 212 receives a signal processed in a baseband and performs an operation for upconverting the received signal into one in an intermediate frequency band or an RF band. For example, the DUC 212 performs channel filtering using a finite impulse response filter and digital upconversion.

A crest factor reducer (CFR) 214 performs an operation for reducing the crest factor or peak-to-average ratio (PAR) of a transmitted signal. A crest factor is a measurement of a waveform calculated by dividing the magnitude of a signal waveform by the root mean square (RMS) value of the waveform. In a wireless communication system, a transmitted signal may have a high crest factor due to other factors, and a high crest factor may damage the efficiency of a power amplifier (PA) 262 included in the analog unit 260. The CFR 214 may detect and eliminate the park value of the transmitted signal, thereby reducing the crest factor.

The digital predistorter (DPD) 216 performs a function of pre-distorting a signal in response to the nonlinearity of the PA 262. That is, due to the operation of the DPD 216, the PA 262 may cause an almost linearized result, thus improving the efficiency of the PA 262. The nonlinear relationship between an input signal and an output signal of the PA 262 may cause interference in a wireless channel. The DPD 216 determines the gain and phase characteristics of the PA 262 and reduces the nonlinearity of the PA 262 on the basis of the determined characteristics.

The DAC 250 converts a digital signal into an analog signal. The DAC 250 converts a digital signal into an analog signal according to a predetermined sampling frequency in order to avoid interference between frequencies.

The PA 262 amplifies the power of a transmitted signal. The transmitted signal may be attenuated in the wireless channel. Thus, the PA 262 may amplify the transmitted signal, thereby increasing the range or gain of the signal. For example, the PA 262 may amplify the signal according to envelope tracking (ET) and average power tracking (APT).

A circulator 264 outputs a signal, input through one port, through one of at least two output ports. This function enables the circulator 264 to prevent the inflow of a signal flowing backwards in a transmission path. For example, as illustrated in FIG. 2, the circulator 264 outputs a transmitted signal to an antenna port and outputs a signal input from the antenna port to a GND.

An analog filter 266 filters an input signal according to the frequency band of a transmitted signal. That is, the analog filter 266 performs a frequency selection function by passing only a desired frequency component among various frequency components of the input signal and attenuating the remaining frequency components. A signal transmitted from the analog filter 266 is output through an antenna port 268. Although FIG. 2 illustrates only one antenna port 268, the wireless communication unit 110 may include at least one antenna array including a plurality of antenna elements.

A VSWR detector 280 measures a voltage standing wave ratio, that is, VSWR, to determine whether the connection of the antenna port of the transmission apparatus 100 is normal or abnormal. The VSWR detector 280 may detect a forward signal and a reverse signal in order to measure the VSWR. In the disclosure, the forward signal may refer to a signal flowing from the PA 262 to the antenna port 268, and the reverse signal may refer to a signal reflected from the antenna port 268 due to an impedance mismatch.

Figure 3A:
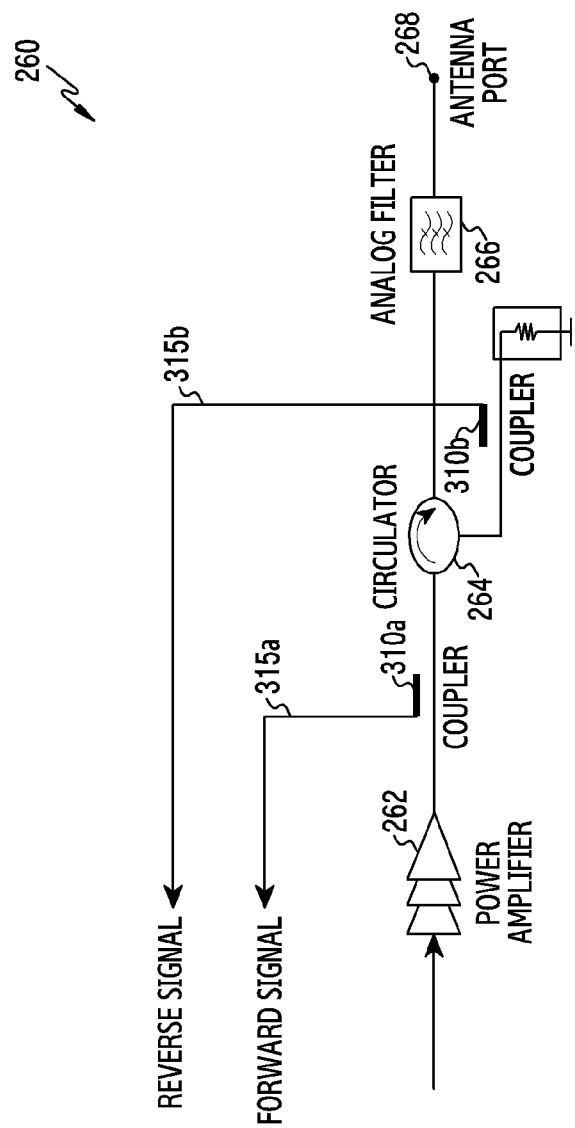
FIG. 3A and FIG. 3B illustrate the configuration of a wireless communication unit for measuring a voltage standing wave ratio (VSWR) according to various embodiments of the disclosure.
Figure 3B:
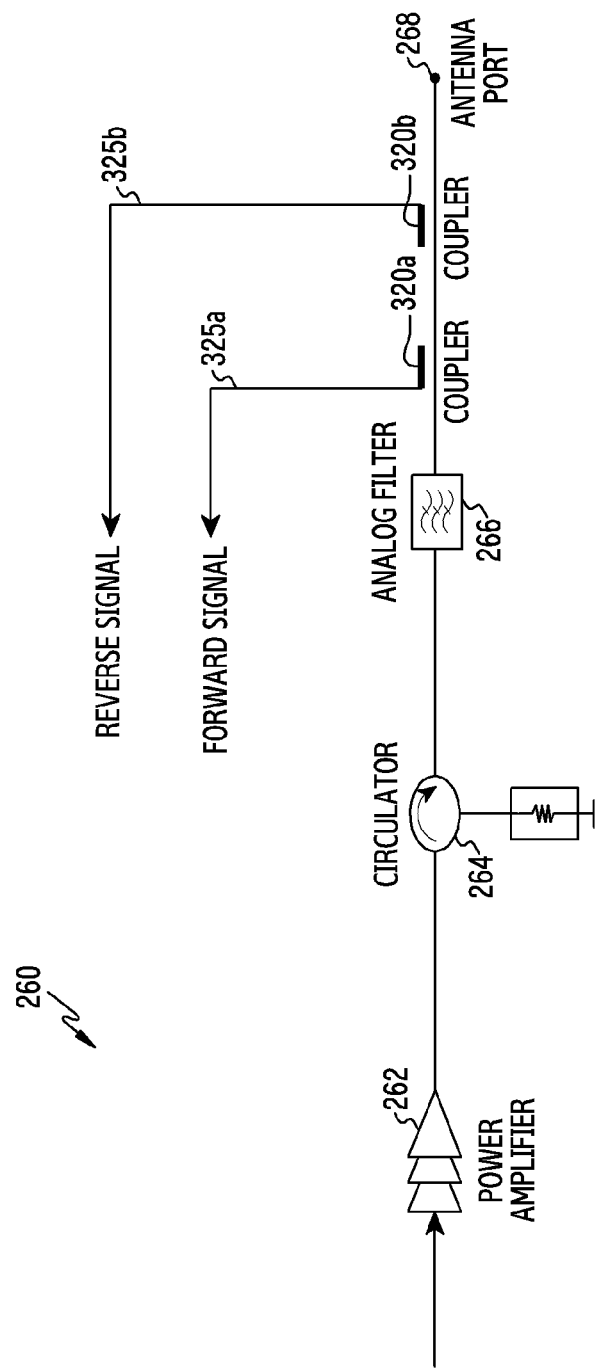

FIG. 3A and FIG. 3B illustrate the configuration of a wireless communication unit for measuring a VSWR according to various embodiments of the disclosure. FIG. 3A illustrates the configuration of a wireless communication unit 110 for measuring a VSWR at an input terminal of an analog filter 266, and FIG. 3B illustrates the configuration of a wireless communication unit 110 for measuring a VSWR at an output terminal of an analog filter 266.

Referring to FIG. 3A, couplers 310a and 310b for detecting a forward signal and a reverse signal are installed at the input terminal of the analog filter 266. For example, as illustrated in FIG. 3A, the coupler 310a may detect a forward signal 315a, and the coupler 310b may detect a reverse signal 315b. According to the configuration illustrated in FIG. 3A, the couplers 310a and 310b may be configured on the same substrate (e.g., a power amp PCR) as a PA 262 and thus do not require a separate connector or cable. Thus, the configuration illustrated in FIG. 3A is simple and can be implemented at a low cost. However, the configuration illustrated in FIG. 3A is a configuration for detecting the forward signal and the reverse signal at the input terminal of the analog filter 266 (or an output terminal of the PA 262) and may thus not consider distortion of a signal that occurs according to the characteristics of the analog filter 266. Therefore, a VSWR measurement method using this configuration may include a relatively great measurement error.

Referring to FIG. 3B, couplers 320a and 320b for detecting a forward signal and a reverse signal are installed at the output terminal of the analog filter 266. For example, as illustrated in FIG. 3B, the coupler 320a may detect a forward signal 325a, and the coupler 320b may detect a reverse signal 325b. According to the configuration illustrated in FIG. 3B, since the couplers 320a and 320b may detect signals in which the characteristics of the analog filter 266 are reflected, a VSWR detector 280 may measure a VSWR having a reduced measurement error. However, in order to measure a VSWR according to the configuration illustrated in FIG. 3B, the wireless communication unit 110 needs to include a separate connector and a separate cable for receiving the detected signals from the couplers 320a and 320b. Thus, a VSWR measurement method using the configuration illustrated in FIG. 3B requires a complex structure and a high cost.

FIG. 4 to FIG. 7 described below illustrate a method for supplementing the disadvantages of the configurations of the wireless communication units illustrated in FIG. 3A and FIG. 3B while utilizing the advantages of the configurations. Specifically, embodiments described below may present a method for reflecting the characteristics of the filter and minimizing distortion of a forward signal and a reverse signal even in a simple structure and low cost, thereby maintaining high measurement accuracy.

In various embodiments, VSWR measurement may be performed through an operation of identifying the characteristics of a filter (e.g., an analog filter 266) and an operation of compensating for a VSWR including an error caused by the filter in consideration of the characteristics of the filter.

Hereinafter, embodiments of measuring the characteristics of an analog filter will be described with reference to FIG. 4 to FIG. 7, and embodiments of measuring a VSWR will be described with reference to FIG. 8 to FIG. 12.

Figure 4:
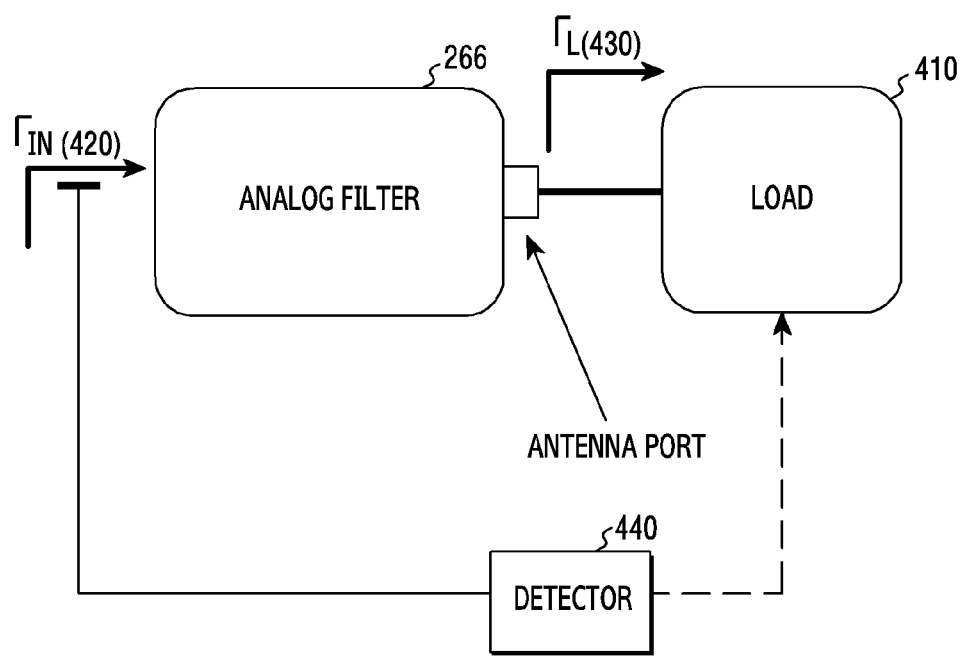
FIG. 4 illustrates part of the configuration of a wireless communication unit for measuring a VSWR at an analog filter according to various embodiments of the disclosure.

FIG. 4 illustrates part of the configuration of a wireless communication unit for measuring a VSWR at an analog filter according to various embodiments of the disclosure.

Referring to FIG. 4, a load 410 is connected to an output terminal of the analog filter 266. The load 410 may have constant impedance and may be variably adjusted to change the power value of an output signal. $\Gamma_{IN}$ 420 denotes a VSWR measured at an input terminal of the analog filter 266. $\Gamma_{IN}$ 420 may be interpreted as a voltage standing wave including both a forward signal and a reverse signal flowing through the input terminal of the analog filter 266. That is, $\Gamma_{IN}$ 420 may denote a voltage standing wave measured without reflecting the characteristics of the filter as shown in FIG. 3A. $\Gamma_L$ 430 denotes a VSWR measured at the output terminal of the analog filter 266. $\Gamma_L$ 430 may be interpreted as a voltage standing wave including both a forward signal and a reverse signal flowing through the output terminal of the analog filter 266. That is, $\Gamma_L$ 430 may denote a voltage standing wave measured with the characteristics of the filter reflected as shown in FIG. 3B.

A detector 440 may measure $\Gamma_{IN}$ 420 while changing the impedance of the load 410. The detector 440 may be a device included in a VSWR 280 or may be a device included in a wireless communication unit 110 separately from the VSWR 280. In addition, the detector 440 may be a device installed outside the wireless communication unit 110.

Figure 5:
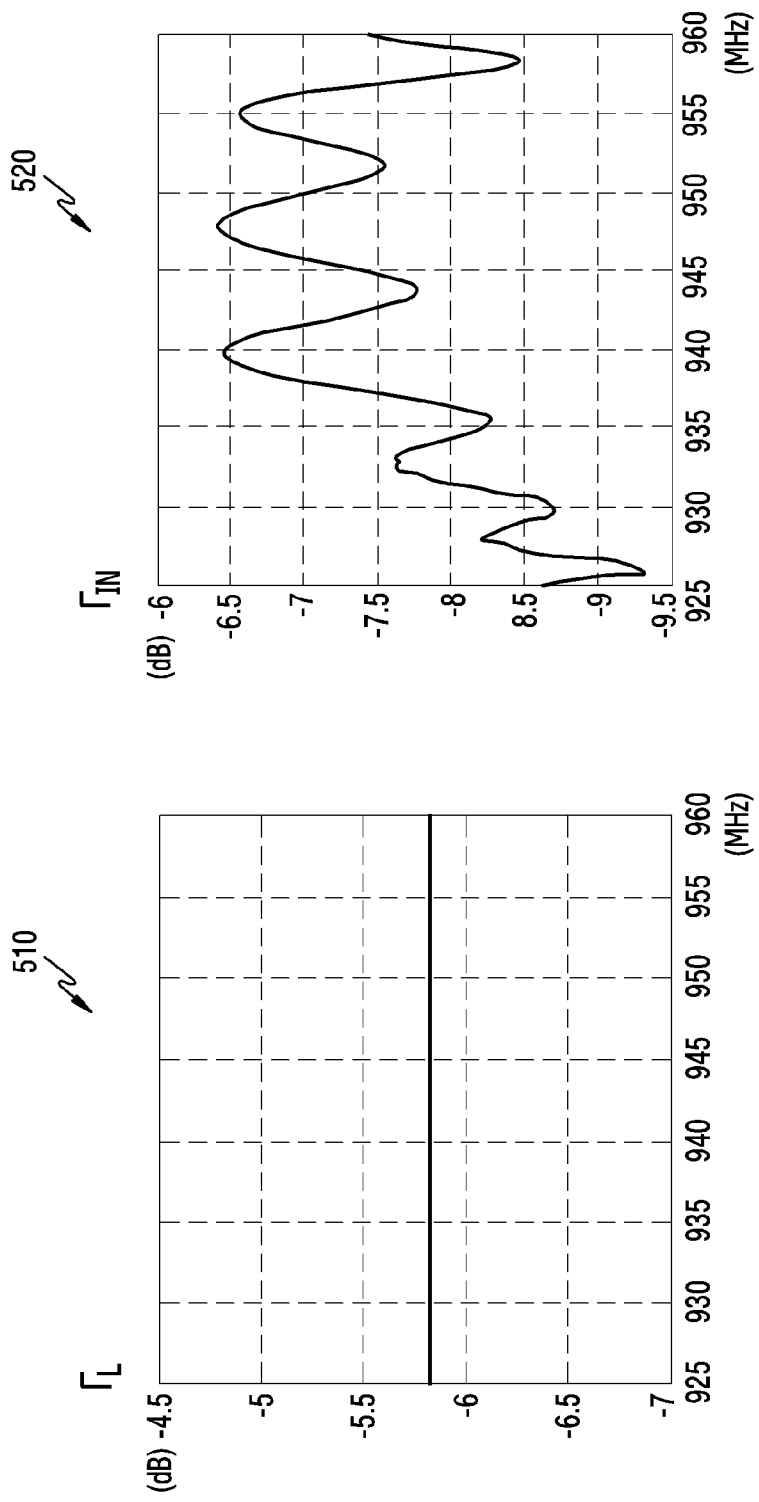
FIG. 5 illustrates an example of a graph showing the power of a signal measured at an analog filter.

FIG. 5 illustrates an example of a graph showing the power of a signal measured at an analog filter.

Referring to FIG. 5, a graph 510 shows $\Gamma_L$ 430 measured according to frequency. A graph 520 shows $\Gamma_{IN}$ 420 measured according to frequency. In the graphs 510 and 520, a horizontal axis denotes a frequency band (unit: MHz). In graphs 510 and 520, a vertical axis denotes a VSWR (unit: dB). $\Gamma_L$ 430 measured at the output terminal of the analog filter 266 has a constant value, whereas $\Gamma_{IN}$ 420 measured at the input terminal of the analog filter 266 has a value changing according to the frequency band. The change occurs because the transmission characteristics of the analog filter 266 are not constant according to frequency. That is, characteristic parameters representing the characteristics of the analog filter 266 may affect $\Gamma_{IN}$ 420.

The relationship between $\Gamma_L$ 430 and $\Gamma_{IN}$ 420 in consideration of the characteristic parameters of the analog filter 266 may be represented by Equation 1.

$$\Gamma_{IN} = S_{11} + \frac{S_{12} S_{21} \Gamma_L}{1 - S_{22} \Gamma_L} \quad \text{Equation 1}$$

Here, $S_{11}$, $S_{12}$, $S_{21}$, and $S_{22}$ respectively denote characteristic parameters of the analog filter 266. The characteristic parameters are based on the assumption that the analog filter 266 is a two-port device. $S_{11}$ denotes a characteristic parameter in the case where a signal is input to the input terminal of the analog filter 266 and is output from the input terminal of the analog filter 266. $S_{22}$ denotes a characteristic parameter in the case where a signal is input to the output terminal of the analog filter 266 and is output from the output terminal of the analog filter 266. $S_{12}$ denotes a characteristic parameter in the case where a signal is input to the output terminal of the analog filter 266 and is output from the input terminal of the analog filter 266. $S_{21}$ denotes a characteristic parameter in the case where a signal is input to the input terminal of the analog filter 266 and is output from the output terminal of the analog filter 266.

Figure 6:
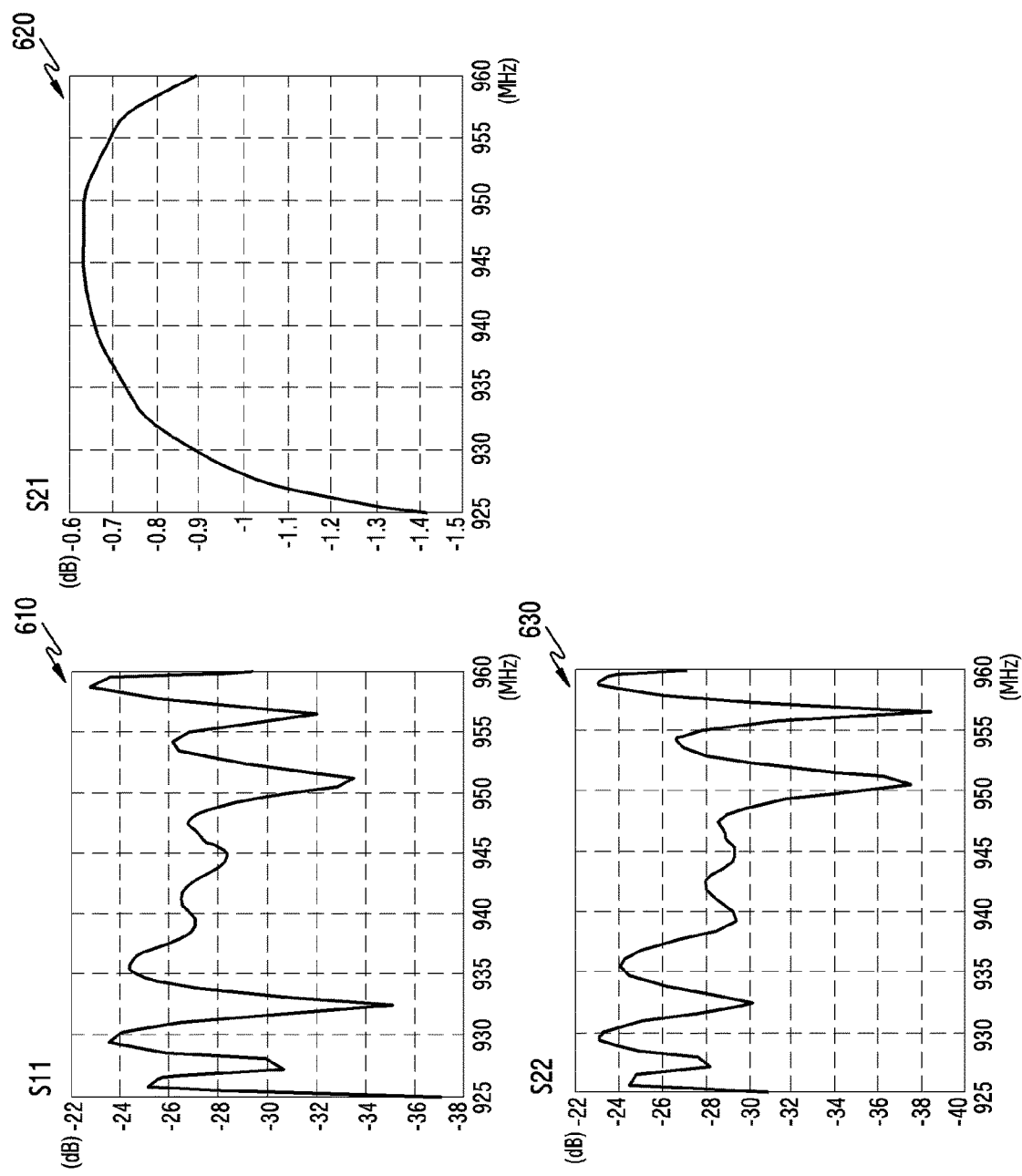
FIG. 6 illustrates an example of a graph showing a characteristic parameter of an analog filter.

FIG. 6 illustrates an example of a graph showing a characteristic parameter of an analog filter.

Referring to FIG. 6, a graph 610 represents $S_{11}$, a graph 620 represents $S_{21}$, and a graph 630 represents $S_{22}$. In the graphs 610, 620, and 630, a horizontal axis denotes a frequency band (unit: MHz). In graphs 610, 620, and 630, a vertical axis denotes power (unit: dB). Since the analog filter 266 is a passive element, $S_{12}=S_{21}$. Thus, a graph representing $S_{12}$ may be the same as the graph 620.

As described above, $\gamma_{IN}$ 420 detected at the input terminal of the analog filter 266 and $\Gamma_L$ 430 detected at the output terminal of the analog filter 266 may have a measurement error due to the characteristic parameters of the analog filter 266. Therefore, when the characteristic parameters of the analog filter 266 are determined and are reflected in $\Gamma_{IN}$ 420, the same effect as detecting a voltage standing wave having high measurement accuracy, such as $\Gamma_L$ 430, may be obtained. Further, since the voltage standing wave is detected at the input terminal of the analog filter 266, the wireless communication unit 100 may be configured with a simple configuration at low cost.

Referring to Equation 1 representing the relationship between $\Gamma_{IN}$ 420 and $\Gamma_L$ 430, $\Gamma_L$ 430 in Equation 1 may be adjusted to a certain value according to the impedance of the load 410 connected to the analog filter 266. The characteristic parameters of the analog filter 266 may be determined by measuring $\Gamma_{IN}$ 420 under a plurality of conditions where the impedance is changed. That is, a transmission apparatus 100 (or a detector 440) may determine the characteristics of the analog filter 266 using the value of $\Gamma_{IN}$ 420 changing depending on the load value.

First, as illustrated below in Equation 2, the relationship between the value of $\Gamma_L$ 430 and resistors included in the load 410 and an analog circuit needs to be assumed.

$$\Gamma_L = \frac{Z_L - Z_0}{Z_L + Z_0} \quad \text{Equation 2}$$

Here, $Z_L$ denotes the impedance of the load 410 illustrated in FIG. 4. $Z_0$ denotes the impedance of the analog circuit. For example, $Z_0$ may be 50 ohm.

In Equation 2, the value of $\gamma_L$ 430 may be determined by adjusting the impedance of the load 410 (i.e., $Z_L$) to an open state, a short-circuit state, and a pre-designated resistance value. In the disclosure, the pre-designated resistance value may change depending on the implementation method. For example, the pre-designated resistance value may be 50 ohm. In another example, when a circulator 264 is not ideal, the forward signal may flow into the path of the reverse signal, and thus a load value higher than 50 ohm may be set in order to increase the measurement level of the reverse signal.

When the impedance of the load 410 is the open state, $Z_L$ is infinite ($\infty$), and thus $\Gamma_L$ 430 may be 1. When the impedance of the load 410 is the short-circuit state, $Z_L$ is 0, and thus $\Gamma_L$ 430 may be −1. When the impedance of the load 410 is the pre-designated resistance value, for example, when $Z_L$ is the same as $Z_0$, which is 50 ohm, $\Gamma_L$ 430 may be 0.

The value of $\Gamma_L$ 430 determined according to each of the conditions of the load 410 is put into Equation 1, thereby obtaining Equation 3.

$$\Gamma_{IN-OPEN} = S_{11} + \frac{S_{12}S_{21}}{1 - S_{22}} \quad \text{Equation 3}$$

$$\Gamma_{IN-SHORT} = S_{11} - \frac{S_{12}S_{21}}{1 - S_{22}}$$

$$\Gamma_{IN-LOAD} = S_{11}$$

Here, $\Gamma_{IN-OPEN}$ denotes the value of $\Gamma_{IN}$ 420 when the load 410 is in the open state (i.e., the value of $\Gamma_L$ 430 is 1). FIN-SHORT denotes the value of $\Gamma_{IN}$ 420 when the load 410 is in the short-circuit state (i.e., the value of $\Gamma_L$ 430 is $\infty$). FIN-LOAD denotes the value of $\Gamma_{IN}$ 420 when the load 410 has the pre-designated resistance value (i.e., the value of $\Gamma_L$ 430 is 0).

Since $\Gamma_{IN}$ 420 is a measurable value and $S_{12}=S_{21}$, the measured values of $\Gamma_{IN-OPEN}$, $\Gamma_{IN-SHORT}$, and $\Gamma_{IN-LOAD}$ are put into Equation 3, thereby obtaining a simultaneous equation. According to the simultaneous equation, the characteristic parameters $S_{11}$, $S_{12}$, $S_{21}$, and $S_{22}$ of the analog filter 266 may be determined.

Assuming that the characteristic parameters $S_{11}$, $S_{12}$, $S_{21}$, and $S_{22}$ are determined, Equation 1 representing the relationship between $\Gamma_L$ 430 and $\Gamma_{IN}$ 420 may be modified into Equation 4 representing $\Gamma_L$ 430.

$$\Gamma_L = \frac{\Gamma_{IN} - S_{11}}{S_{12}^2 + \Gamma_{IN}S_{22} - S_{11}S_{22}} \quad \text{Equation 4}$$

$\Gamma_{IN}$ denotes a VSWR measured at the input terminal of the analog filter 266, and $\Gamma_L$ denotes a VSWR measured at the output terminal of the analog filter 266. $S_{11}$ denotes a characteristic parameter in the case where a signal is input to the input terminal of the analog filter 266 and is output from the input terminal of the analog filter 266; $S_{22}$ denotes a characteristic parameter in the case where a signal is input to the output terminal of the analog filter 266 and is output from the output terminal of the analog filter 266; $S_{12}$ denotes a characteristic parameter in the case where a signal is input to the output terminal of the analog filter 266 and is output from the input terminal of the analog filter 266; and $S_{21}$ denotes a characteristic parameter in the case where a signal is input to the input terminal of the analog filter 266 and is output from the output terminal of the analog filter 266.

That is, when a particular load is connected to an antenna port of the transmission apparatus 110, $\Gamma_L$ 430 may be determined on the basis of the measured characteristic parameters of the analog filter 266 and $\Gamma_{IN}$ 420 measured at the input terminal of the analog filter 266.

Figure 7:
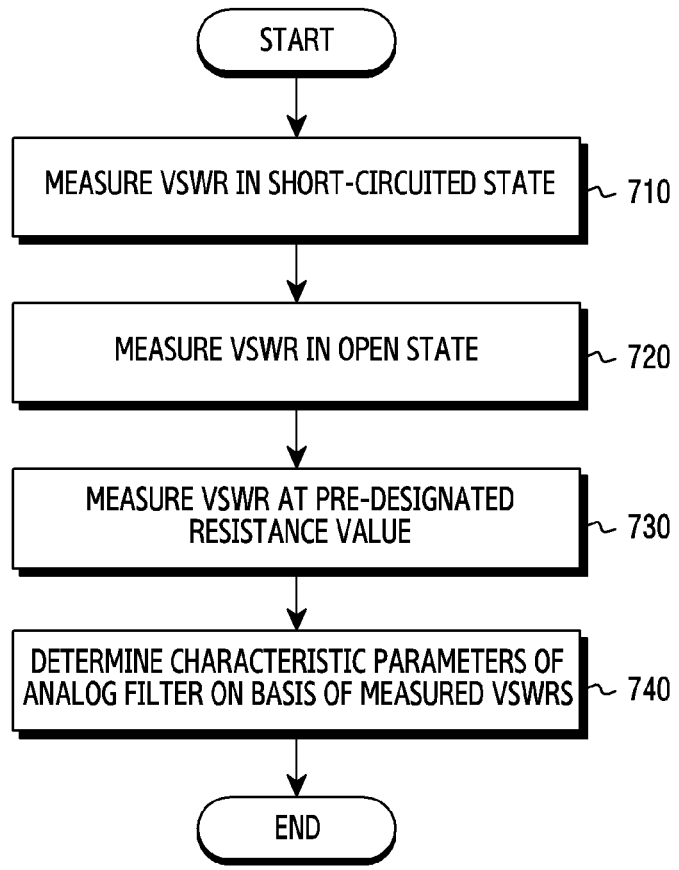
FIG. 7 illustrates the flow of an operation of determining characteristic parameters of an analog filter according to various embodiments of the disclosure.

FIG. 7 illustrates the flow of an operation of determining characteristic parameters of an analog filter according to various embodiments of the disclosure. Although individual operations illustrated in FIG. 7 are described as being implemented by the transmission apparatus 100, the operations may be implemented by the controller 140, the VSWR detector 280, or the detector 440 included in the transmission apparatus 100 or by another controller (not shown) included in the wireless communication unit 110, or may be implemented by a separate measurement device or an electronic device in addition to the transmission apparatus 100 according to the implementation method.

Referring to FIG. 7, in operation 710, when a load connected to the output terminal of the analog filter 266 is in a short-circuit state, the transmission apparatus 100 measures a VSWR (hereinafter, "first VSWR") at the input terminal of the analog filter 266. According to an embodiment, the transmission apparatus 100 may simultaneously measure a forward signal, which flows through the input terminal of the analog filter 266, and a reverse signal, which flows through the input terminal of the analog filter 266, in order to measure the first VSWR. In another embodiment, the transmission apparatus 100 may separately measure the forward signal, which flows through the input terminal of the analog filter 266, and the reverse signal, which flows through the input terminal of the analog filter 266, in order to measure the first VSWR, in which case the forward signal may be a digital distortion signal.

In operation 720, when the load connected to the output terminal of the analog filter 266 is in an open state, the transmission apparatus 100 measures a VSWR (hereinafter, "second VSWR") at the input terminal of the analog filter 266. Similarly to operation 710, the transmission apparatus 100 may simultaneously or separately measure the forward signal, which flows through the input terminal of the analog filter 266, and the reverse signal, which flows through the input terminal of the analog filter 266, in order to measure the second VSWR.

In operation 730, when the load connected to the output terminal of the analog filter 266 has a pre-designated resistance value, the transmission apparatus 100 measures a VSWR (hereinafter, "third VSWR") at the input terminal of the analog filter 266. The pre-designated resistance value may be determined to be various values depending on the degree to which the forward signal flows into the path of the reverse signal. For example, the pre-designated resistance value may be 50 ohm.

In operation 740, the transmission apparatus 100 determines characteristic parameters of the analog filter 266 on the basis of the measured first, second, and third VSWRs. That is, the transmission apparatus 100 may identify the transmission characteristics of the analog filter 266 through an operation implemented in operation 740. The transmission apparatus 100 may compensate for an error between a VSWR at the output terminal of the analog filter 266 and a VSWR at the input terminal of the analog filter 266 on the basis of the determined characteristic parameters of the analog filter 266.

Figure 8:
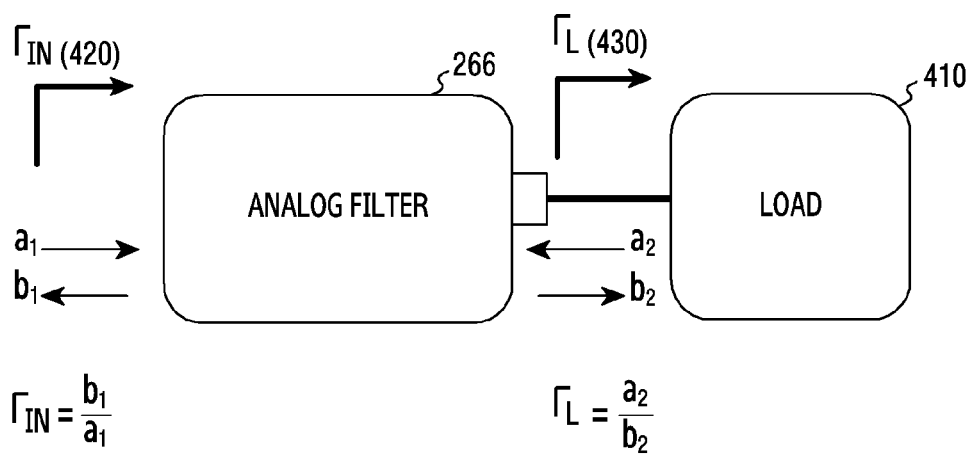
FIG. 8 illustrates part of the configuration of a wireless communication unit for determining a VSWR using a forward signal and a reverse signal measured at an analog filter according to various embodiments of the disclosure.

FIG. 8 illustrates part of the configuration of a wireless communication unit for determining a VSWR using a forward signal and a reverse signal measured at an analog filter according to various embodiments of the disclosure.

Referring to FIG. 8, $\Gamma_{IN}$ 420 includes a forward signal $a_1$ and a reverse signal $b_1$ flowing in an input terminal of an analog filter 266. The signals $a_1$ and $b_1$ may be detected by a VSWR 280, or may be detected by a detector 440 according to an implementation method. $\Gamma_L$ 430 may include a reverse signal $a_2$ and a forward signal $b_2$ flowing in the input terminal of the analog filter 266.

In order to use the characteristic parameters of the analog filter determined as described in FIG. 4 to FIG. 7, $\Gamma_L$ 430 and $\Gamma_{IN}$ 420 in Equation 4 may be expressed using the forward signals $a_1$ and $b_2$ and the reverse signals $b_1$ and $a_2$ as in Equation 5.

$$\frac{a_2}{b_2} = \frac{\frac{b_1}{a_1} - S_{11}}{S_{12}^2 + \frac{b_1}{a_1}S_{22} - S_{11}S_{22}} \qquad \text{Equation 5}$$

Here, $a_1$ denotes the forward signal flowing in the input terminal of the analog filter 266, $a_2$ denotes the reverse signal flowing in the output terminal of the analog filter 266, $b_1$ denotes the reverse signal flowing in the input terminal of the analog filter 266, and $b_2$ denotes the forward signal flowing in the output terminal of the analog filter 266.

Equation 5 may be organized into Equation 6 below.

$$\frac{a_2}{b_2} = \frac{b_1 - a_1 S_{11}}{b_1 S_{22} + a_1(S_{12}^2 - S_{11}S_{22})} \qquad \text{Equation 6}$$

That is, when the signals $a_1$ and $b_1$ flowing in the input terminal of the analog filter 266 are measured, the signals $a_2$ and $b_2$ may be determined on the basis of a predetermined characteristic parameter of the analog filter 266. A VSWR at the output terminal of the analog filter 266 may be determined on the basis of determined $a_2$ and $b_2$.

Figure 9:
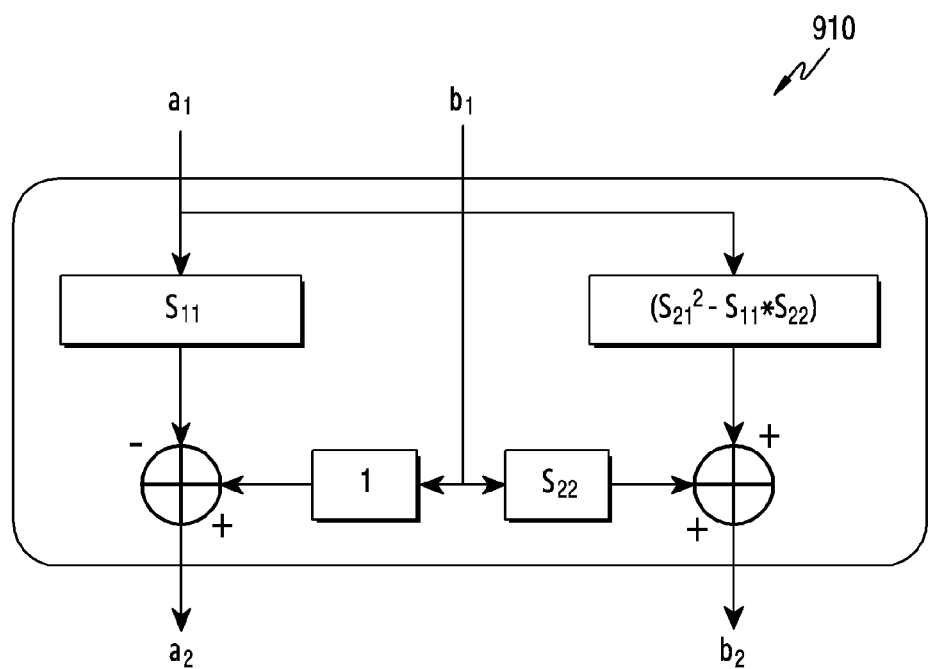
FIG. 9 illustrates a functional block of a digital filter according to various embodiments of the disclosure.

FIG. 9 illustrates a functional block of a digital filter according to various embodiments of the disclosure. The digital filter 910 may be a hardware logical structure, a software program, or a combination of hardware and software.

Referring to FIG. 9, the digital filter 910 includes a plurality of blocks including characteristic parameters of an analog filter 266. According to the implementation method, each of the blocks may be one digital filter. Alternatively, the plurality of blocks may form one digital filter 910. The digital filter 910 may filter detected signals $a_1$ and $b_1$ to generate signals $a_2$ and $b_2$. The generated signals $a_2$ and $b_2$ are used to calculate the VSWR of an antenna port. In addition, the VSWR may be represented as a return loss at the antenna port, in which case the return loss may be represented by Equation 7.

Antenna Port Return Loss $[dB]$=$a_2$ detection power $[dBm]$−$b_2$ detection power $[dBm]$ $\qquad$ Equation 7

Here, $a_2$ detection power denotes the power of the signal $a_2$ in dBm, and $b_2$ detection power denotes the power of the signal $b_2$ in dBm.

Figure 10:
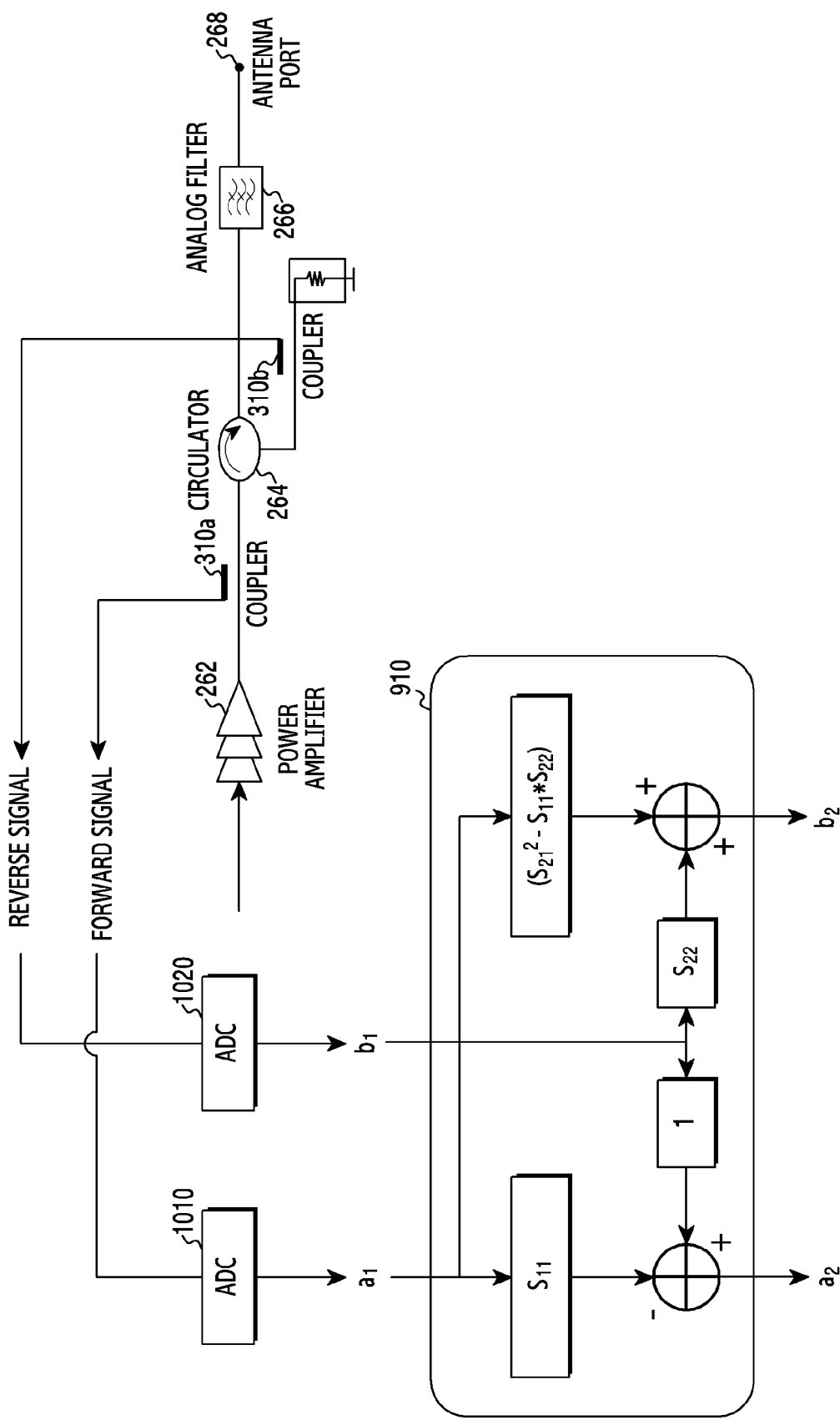
FIG. 10 illustrates the configuration of a wireless communication unit including a digital filter according to various embodiments of the disclosure.

FIG. 10 illustrates the configuration of a wireless communication unit including a digital filter according to various embodiments of the disclosure.

Referring to FIG. 10, a forward signal $a_1$ and a reverse signal $b_1$ for measuring the VSWR of an antenna port 268 are detected respectively by couplers 310a and 310b installed at an input terminal of an analog filter 266. The detected signals $a_1$ and $b_1$ are converted into digital signals by analog-digital converters (ADCs) 1010 and 1020, respectively. A digital filter 910 filters the converted signals $a_1$ and $b_1$, thereby generating signals $a_2$ and $b_2$.

The signals $a_1$ and $b_1$ may be measured by various methods according to the implementation method. For example, the signals $a_1$ and $b_1$ may be simultaneously measured by the couplers 310a and 310b. In another example, the signals $a_1$ and $b_1$ may be separately measured. In this case, the signal $a_1$ may be a digital predistorted signal generated by a DPD 216.

The digital filter 910 may be included in the wireless communication unit 110 by various methods depending on the implementation method. For example, the digital filter 910 may be included in a VSWR detector 280 or may be separately disposed outside the VSWR 280. A transmission apparatus 100 may measure the VSWR using the digital filter 910 included in the wireless communication unit 110 in view of the characteristics of the filter even when the filter is embedded in the transmission apparatus 100.

Figure 11:
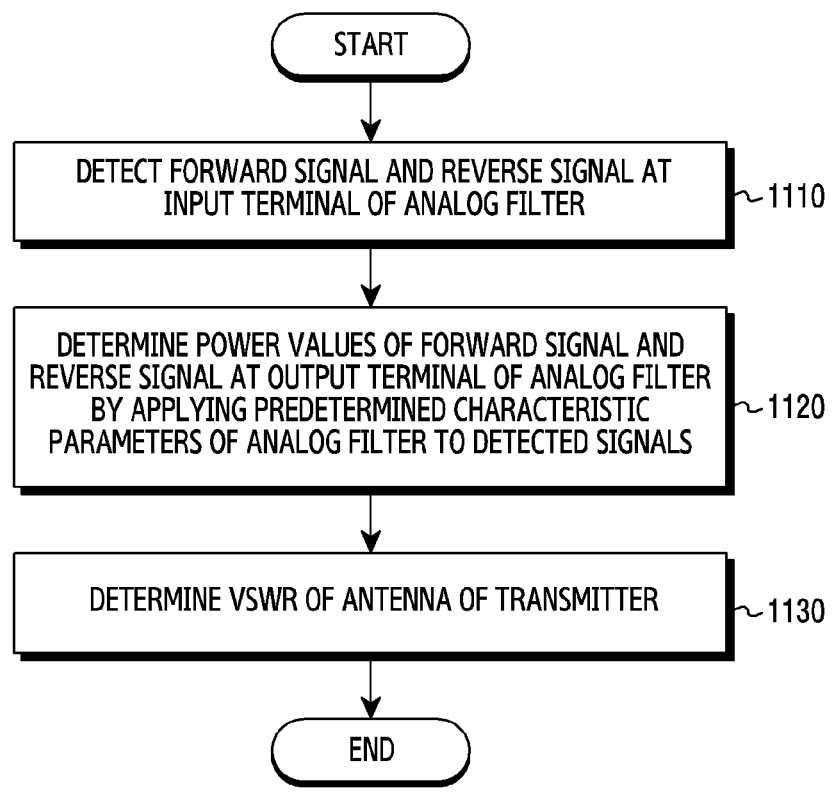
FIG. 11 illustrates the flow of the operation of a transmission apparatus for determining the VSWR of an antenna according to various embodiments of the disclosure.

FIG. 11 illustrates the flow of the operation of a transmission apparatus 100 for determining the VSWR of an antenna according to various embodiments of the disclosure. Although individual operations illustrated in FIG. 11 are described as being implemented by the transmission apparatus 100, the operations may be implemented by the controller 140 or the VSWR detector 280 included in the transmission apparatus 100 or by another controller (not shown) included in the wireless communication unit 110.

Referring to FIG. 11, in operation 1110, the transmission apparatus 100 detects a forward signal $a_1$ and a reverse signal $b_1$ at an input terminal of an analog filter 266. The signals $a_1$ and $b_1$ may simultaneously be detected by the transmission apparatus or may not simultaneously be measured. When the signals $a_1$ and $b_1$ are not simultaneously detected, the signal $a_1$ may be a digital predistorted signal.

In operation 1120, the transmission apparatus 100 applies predetermined characteristic parameters of the analog filter 266 to the detected signals $a_1$ and $b_1$, thereby determining the power values of a forward signal $b_2$ and a reverse signal $a_2$ at an output terminal of the analog filter 266. For example, the transmission apparatus 100 may filter the signals $a_1$ and $b_1$ using the digital filter 910, thereby determining the power values of the signals $b_2$ and $a_2$. An individual characteristic parameter of the digital filter 910 is determined on the basis of the characteristic parameters of the analog filter 266. Each of the characteristic parameters of the analog filter 266 is determined on the basis of VSWRs at the input terminal of the analog filter 266, which are measured when a load connected to the output terminal of the analog filter is short-circuited, open, and a pre-designated resistance value. The pre-designated resistance value may be, for example, 50 ohm.

In operation 1130, the transmission apparatus 100 determines the VSWR of an antenna port of the transmission apparatus 100 on the basis of the determined power values of $a_2$ and $b_2$. The transmission apparatus 100 may determine whether the antenna port normally operates by comparing whether the determined VSWR exceeds a predetermined reference range.

Figure 12:
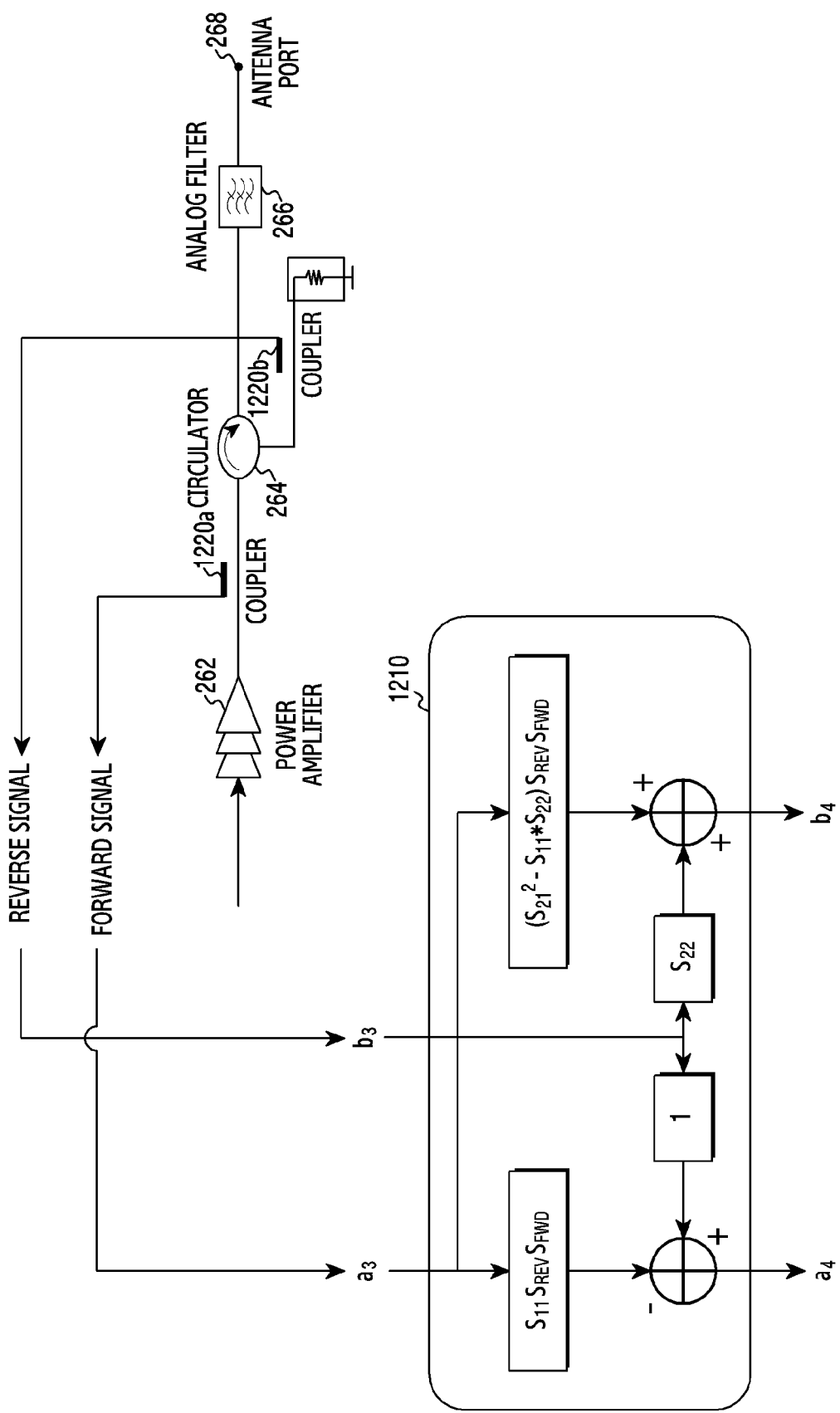
FIG. 12 illustrates the configuration of a wireless communication unit for compensating for a measurement error caused by a power amplifier according to various embodiments of the disclosure.

FIG. 12 illustrates the configuration of a wireless communication unit for compensating for a measurement error caused by a power amplifier according to various embodiments of the disclosure.

When the VSWR of an antenna port of a transmission apparatus 100 is measured, the VSWR may have an error due to not only an analog filter but also other components included in the wireless communication unit 110. For example, a VSWR measurement error may occur due to a structural characteristic of a PA 262 illustrated in FIG. 12.

In this case, the transmission apparatus 100 may calculate a characteristic parameter of the PA 262 to perform compensation. For example, as described with reference to FIG. 7, the transmission apparatus 100 may measure a VSWR according to various states of a load connected to an output terminal of the PA 262 and may determine a characteristic parameter of the PA 262 on the basis of the measured VSWR. A digital filter 1210 generated on the basis of the determined characteristic parameter may filter a forward signal $a_3$ and a reverse signal $b_3$ detected respectively by couplers 1220a and 1220b, thereby generating signals $a_4$ and $b_4$.

Methods according to embodiments stated in claims and/or specifications of the disclosure may be implemented in hardware, software, or a combination of hardware and software.

When the methods are implemented by software, a computer-readable storage medium for storing one or more programs (software modules) may be provided. The one or more programs stored in the computer-readable storage medium may be configured for execution by one or more processors within the electronic device. The at least one program may include instructions that cause the electronic device to perform the methods according to various embodiments of the disclosure as defined by the appended claims and/or disclosed herein.

The programs (software modules or software) may be stored in non-volatile memories including a random access memory and a flash memory, a Read Only Memory (ROM), an Electrically Erasable Programmable Read Only Memory (EEPROM), a magnetic disc storage device, a Compact Disc-ROM (CD-ROM), Digital Versatile Discs (DVDs), or other type optical storage devices, or a magnetic cassette. Alternatively, any combination of some or all of the may form a memory in which the program is stored. Further, a plurality of such memories may be included in the electronic device.

In addition, the programs may be stored in an attachable storage device which is accessible through communication networks such as the Internet, Intranet, local area network (LAN), wide area network (WAN), and storage area network (SAN), or a combination thereof. Such a storage device may access the electronic device via an external port. Further, a separate storage device on the communication network may access a portable electronic device.

In the above-described detailed embodiments of the disclosure, a component included in the disclosure is expressed in the singular or the plural according to a presented detailed embodiment. However, the singular form or plural form is selected for convenience of description suitable for the presented situation, and various embodiments of the disclosure are not limited to a single element or multiple elements thereof. Further, either multiple elements expressed in the description may be configured into a single element or a single element in the description may be configured into multiple elements.

While the disclosure has been shown and described with reference to certain embodiments thereof, it will be understood by those skilled in the art that various changes in form and details may be made therein without departing from the scope of the disclosure. Therefore, the scope of the disclosure should not be defined as being limited to the embodiments, but should be defined by the appended claims and equivalents thereof.

The invention claimed is:

1. A method for operating a transmitter in a wireless communication system, the method comprising:
   detecting a forward signal and a reverse signal at an input terminal of an analog filter;
   calculating a power value of a forward signal and a power value of a reverse signal at an output terminal of the analog filter based on characteristic parameters of the analog filter indicating characteristics of the analog filter and the detected forward signal and reverse signal;
   determining a voltage standing wave ratio (VSWR) of the input terminal and the output terminal of the analog filter based on the calculated power value of the forward signal and the power value of the reverse signal at the input terminal and the output terminal of the analog filter;
   compensating an error between the VSWR at the output terminal of the analog filter and the VSWR at the input terminal of the analog filter based on characteristic parameters of a digital filter; and determining a VSWR of an antenna of the transmitter based on the compensated error;

wherein the characteristic parameters of the analog filter are determined based on a relationship between signals input or output to the input terminal or the output terminal of the analog filter; and wherein the forward signal and the reverse signal of the output terminal of the analog filter are generated by the digital filter and the characteristic parameters of digital filter are determined based on the determined characteristic parameters of the analog filter.

2. The method of claim 1, wherein each of the characteristic parameters of the analog filter is determined on the basis of VSWRs at the input terminal of the analog filter, which are measured when a load connected to the output terminal of the analog filter is in a short-circuited state, is in an open state, and has a pre-designated resistance value.

3. The method of claim 2, wherein the pre-designated resistance value is 50 ohm.

4. The method of claim 1, wherein the detecting of the forward signal and the reverse signal at the input terminal of the analog filter comprises simultaneously detecting the forward signal and the reverse signal at the input terminal of the analog filter using a coupler installed at the input terminal of the analog filter.

5. The method of claim 1, wherein the detecting of the forward signal and the reverse signal at the input terminal of the analog filter comprises:
   detecting a digital predistorted signal of the forward signal at the input terminal of the analog filter; and
   detecting the reverse signal at the input terminal of the analog filter.

6. A transmitter in a wireless communication system, the transmitter comprising:
   at least one antenna port configured to transmit and receive a signal;
   an analog filter configured to perform a frequency selection function of the signal; and
   a voltage standing wave ratio (VSWR) detector configured to measure a VSWR of the antenna port,
   wherein the VSWR detector:
      detects a forward signal and a reverse signal at an input terminal of the analog filter;
      calculates a power value of a forward signal and a power value of a reverse signal at an output terminal of the analog filter based on characteristic parameters of the analog filter indicating characteristics of the analog filter and the detected forward signal and reverse signal;
      determines a VSWR of the input terminal and the output terminal of the analog filter based on the calculated power value of the forward signal and the power value of the reverse signal at the input terminal and the output terminal of the analog filter; and
      compensate an error between the VSWR at the output terminal of the analog filter and the VSWR at the input terminal of the analog filter based on characteristic parameters of a digital filter; and
      determines the VSWR of the antenna port of the transmitter based on the compensated error;
   wherein the characteristic parameters of the analog filter are determined based on a relationship between signals input or output to the input terminal or the output terminal of the analog filter; and
   wherein the forward signal and the reverse signal of the output terminal of the analog filter are generated by the digital filter and the characteristic parameters of the digital filter are determined based on the determined characteristic parameters of analog filter.

7. The transmitter of claim 6, wherein each of the characteristic parameters of the analog filter is determined based on VSWRs at the input terminal of the analog filter, which are measured when a load connected to the output terminal of the analog filter is in a short-circuited state, is in an open state, and has a pre-designated resistance value.

8. The transmitter of claim 7, wherein the pre-designated resistance value is 50 ohm.

9. The transmitter of claim 6, wherein the VSWR detector simultaneously detects the forward signal and the reverse signal at the input terminal of the analog filter using a coupler installed at the input terminal of the analog filter.

10. The transmitter of claim 6, wherein the VSWR detector detects a digital predistorted signal of the forward signal at the input terminal of the analog filter and detects the reverse signal at the input terminal of the analog filter.

11. An apparatus for determining characteristic parameters of an analog filter in a wireless communication system, the apparatus comprising:
   a detector configured to detect a signal flowing in an input terminal and an output terminal of the analog filter; and
   a controller configured to be combined with the detector, wherein the controller:
      measures a first voltage standing wave ratio (VSWR) at the input terminal of the analog filter when a load connected to the output terminal of the analog filter is in a short-circuited state;
      measures a second VSWR at the input terminal of the analog filter when the load connected to the output terminal of the analog filter is in an open state;
      measures a third VSWR at the input terminal of the analog filter when the load connected to the output terminal of the analog filter has a pre-designated resistance value, wherein the characteristic parameters indicating characteristics of the analog filter are determined based on the measured first, second, and third VSWRs;
      determines the characteristic parameters of the analog filter based on a relationship between signals input or output to the input terminal or the output terminal of the analog filter; and
      determines characteristic parameters of a digital filter for compensating for an error between a VSWR at the output terminal of the analog filter and the measured first, second, and third VSWR at the input terminal of the analog filter based on values of the determined characteristic parameters of the analog filter.

12. The apparatus of claim 11, wherein the pre-designated resistance value is 50 ohm.

13. The apparatus of claim 11, wherein the detector simultaneously detects a forward signal flowing into the input terminal of the analog filter and a reverse signal flowing out from the input terminal of the analog filter.

14. The apparatus of claim 11, wherein the detector is configured to measure a digital predistorted signal of a forward signal flowing into the input terminal of the analog filter and to measure a reverse signal flowing out from the input terminal of the analog filter.

* * * * *